United States Patent [19]

Matsumoto

[11] Patent Number: 4,550,357
[45] Date of Patent: Oct. 29, 1985

[54] INTERCONNECTED PRINTED CIRCUIT BOARDS AND METHOD OF CONNECTING CIRCUIT BOARDS

[75] Inventor: Hirofumi Matsumoto, Ibaraki, Japan

[73] Assignee: Nippon Mektron, Ltd., Japan

[21] Appl. No.: 508,281

[22] Filed: Jun. 27, 1983

[30] Foreign Application Priority Data

Jun. 30, 1982 [JP] Japan .................................. 57-113009

[51] Int. Cl.[4] .......................... H05K 1/00; H01B 11/02
[52] U.S. Cl. ..................................... 361/398; 361/412; 174/117 PC
[58] Field of Search ............... 361/398, 408, 400, 412; 174/117 A, 117 PC, 117.6, 117 FF; 357/66, 67; 339/17 F, 17 LC, 176 MF

[56] References Cited

U.S. PATENT DOCUMENTS

| | | | |
|---|---|---|---|
| 2,854,502 | 9/1958 | Richter | 174/117 PC X |
| 3,772,776 | 11/1973 | Weisenburger | 361/398 X |
| 3,836,824 | 9/1974 | Watrous | 361/398 |
| 4,113,981 | 9/1978 | Fujita et al. | 339/17 F X |
| 4,180,711 | 12/1979 | Hirata et al. | 361/398 X |
| 4,203,053 | 5/1980 | Shepard | 174/117 A X |
| 4,251,683 | 2/1981 | Oughton, Jr. et al. | 174/117 FF X |
| 4,302,065 | 11/1981 | Taylor | 339/17 F |
| 4,457,796 | 7/1984 | Needham | 361/398 X |

Primary Examiner—Vit W. Miska
Attorney, Agent, or Firm—Fishman & Dionne

[57] ABSTRACT

Interconnected printed circuit boards and a method of connecting different types of printed circuit boards is presented. The method is particularly well suited for connecting the circuit patterns of a flexible printed circuit board to the corresponding circuit patterns of a hard printed circuit board and is easily accomplished by the novel utilization of an electroconductive adhesive. The adhesive connection of the present invention also provides improved ease of separability of the connected circuit boards.

5 Claims, 5 Drawing Figures

INTERCONNECTED PRINTED CIRCUIT BOARDS AND METHOD OF CONNECTING CIRCUIT BOARDS

BACKGROUND OF THE INVENTION

This invention relates to the structure of interconnected printed circuit boards of different kinds, and to a method of connecting different kinds of printed circuit boards. More particularly, this invention relates to a new and improved structure and method of connecting the circuit patterns of a flexible printed circuit board to the corresponding circuit patterns of a hard or rigid printed circuit board utilizing an electroconductive adhesive.

An enormous number of electronic devices require the concurrent use of both flexible and rigid or hard printed circuit boards (pcb). Often these flexible and hard printed circuit boards must be connected to each other within an electronic instrument. Various methods have been proposed to effect a connection of this type such as soldering. Unfortunately, all of the prior art connecting methods require highly skilled and time consuming techniques. Additionally, specially designed reinforcement structures for use in increasing the reliability of the connection between the two patterns are often needed. As a consequence, many problems have arisen in utilizing the above discussed methods including high labor and material costs. A further problem is that the previously used connecting methods are relatively permanent. Thus, if the connected printed circuit boards have to be separated, this separation proved to be troublesome and costly if it can be effected at all without destroying one or both boards.

SUMMARY OF THE INVENTION

The above discussed and other problems of the prior art are overcome or alleviated by the structure and method of connecting printed circuit boards of the present invention. In accordance with the present invention, an improved structure and method of connecting the circuit patterns of a flexible printed circuit board to the corresponding circuit patterns of a hard printed circuit board is achieved by use of an electroconductive adhesive.

The novel use of an electroconductive adhesive to connect different kinds of printed circuit boards provides a far more simplified connection structure and method than previously found in the prior art. This simplified method results in lower production cost due to decreased material and labor cost as well as providing for ease of separation of the connected boards should any problem arise subsequent to the initial connection.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the several FIGURES.

DESCRIPTION OF THE PREFERRED EMBODIMENT

Figure 1:
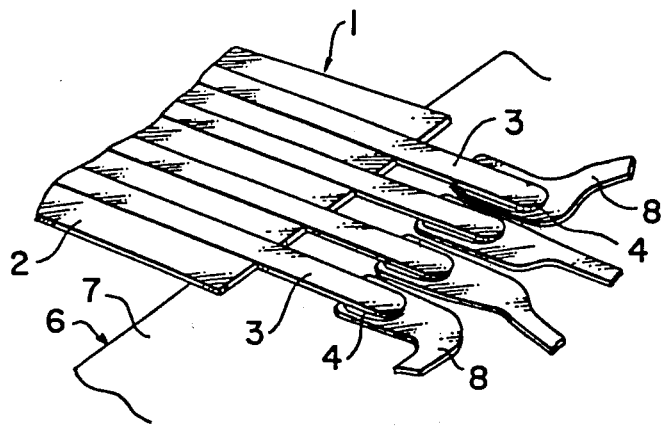
FIG. 1 is a perspective view of a connection between a flexible printed circuit board and a hard printed circuit board in accordance with the present invention.
Figure 2:
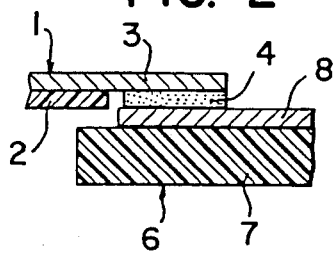
FIG. 2 is an enlarged cross-sectional elevation view of one interconnection of the circuit boards of FIG. 1.

Referring jointly to FIGS. 1 and 2, a connection made in accordance with a first embodiment of the present invention is shown. A flexible printed circuit board, shown generally at 1, is comprised of an insulating base material 2 with a printed circuit pattern 3 thereon. A rigid or hard circuit board, shown generally at 6, is comprised of an insulating base material 7 with a circuit pattern 8 thereon. The circuit patterns are adhesively, mechanically and electrically interconnected by an electroconductive adhesive 4, as best seen in FIG. 2. In this embodiment the circuit elements 3 extend beyond the insulating base material 2, and the adhesive is initially applied to the underside of the elements 3.

In order to connect the circuit patterns 8 on the hardboard 6 to the respective and corresponding circuit patterns 3 on the flexible circuit board 1, electroconductive adhesive 4 is applied to that portion of one or both circuit patterns to be connected. Next, a visual alignment of the corresponding patterns is made and finally the circuit patterns 3 and 8 are physically brought together and pressed so as to physically join and electrically connect the circuit patterns of the two different printed circuit boards to each other.

The novel structure and connecting method of the present invention provides a simple and inexpensive approach to connecting flexible circuit boards to hardboards which has heretofore been accomplished only by sophisticated and/or technical procedures. Furthermore, unlike the prior connection techniques, with proper selection of adhesive material, the present invention allows for relatively easy removal of the adhesively connected circuit boards by various means of disengagement well known to those skilled in the art.

Figure 3:
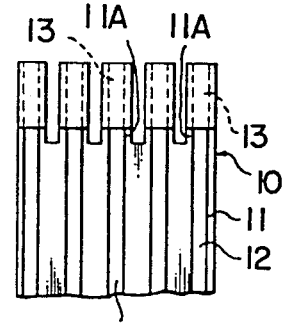
FIG. 3 is a planar view of a flexible printed circuit board in accordance with another embodiment of the present invention.
Figure 4:
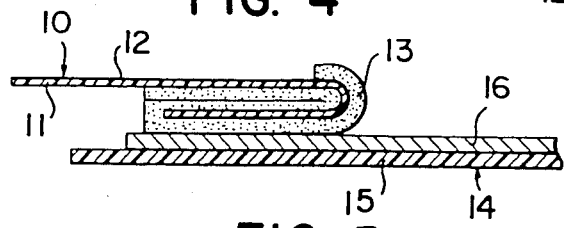
FIG. 4 is an enlarged cross-sectional view of the circuit board of FIG. 3 connected to a hard printed circuit board in accordance with a second embodiment of the method of the present invention.

Referring now to FIGS. 3 and 4, a second embodiment of the present invention is shown wherein the end portion of the insulating base material 11 of flexible printed circuit board 10 is shaped like the teeth of a comb. The circuit patterns 12 which are attached to the base 11 extend out to the end of each particular tooth 11A at the end of the base 11. An electroconductive adhesive 13 is applied to both the top surface of the ends of the circuit pattern 12 and to the bottom base material surface of each tooth 11A of the base 11. The tooth structure of the base 11 of FIG. 3 is provided in order to prevent the adhesive 13 from short-circuiting adjoining circuit patterns 12.

After application of the adhesive 13 to the base teeth 11A and circuit patterns 12 as described above, the teeth 11A are bent back upon themselves, as shown in FIG. 4, so that the adhesive applied to the bottom surface of the teeth 11A overlap and form a single integrated or overlapping structure. A hard circuit board 14 having an insulating base material 15 with circuit patterns 16 thereon can then be adhesively connected to the flexible circuit board 10. As in the previous example shown in FIGS. 1 and 2, the respective circuit patterns 12 and 16 must be corresponding patterns. The connection is accomplished by visually matching up the respective circuit patterns 12 and 16 and subsequently pressing the patterns 12 and the patterns 16 into physical and electrical contact through the electroconductive adhesive 13.

As previously noted in discussing the structure and methods of FIGS. 1 through 4, the present invention provides a structure and method of connection having low production cost, also being characterized by ease of separation if a problem arises in one of the connected circuit boards.

The method of the present invention permits the connection between the respective, corresponding patterns to be reinforced by application of a nonelectroconductive adhesive tape over the adhesively connected patterns. This added reinforcement results in increased durability of the connection against vibration and other fatigue factors.

Figure 5:
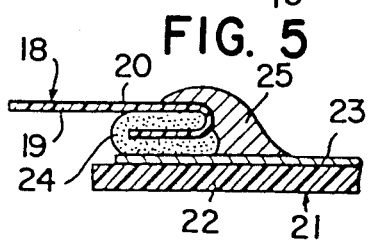
FIG. 5 is a cross-sectional elevation view of a connection, similar to FIG. 4, incorporating a reinforcement.

Finally, if a particular connection between different circuit boards is of the type in which it is very unlikely that a subsequent separation will be needed, then a more permanent connection may be utilized in conjunction with the present invention as shown in FIG. 5. In FIG. 5, a connection according to FIG. 4 has been subsequently reinforced with solder 25. As shown, the circuit pattern 20 applied to insulating base material 19 of flexible circuit board 18 is adhesively connected by electroconductive adhesive 24 to the circuit pattern 23 on base material 22 of hardboard 21. Thus, the solder 25 acts to completely and more permanently connect the corresponding patterns 20 and 23.

In accordance with the structure and method of the present invention, the circuit patterns of flexible and hard circuit boards can be simply and easily connected at low cost and little labor using an electroconductive adhesive. These adhesively connected patterns are then easily separable after the connection is obtained thereby providing an improved efficiency during inspections, part exchanges and repairs.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of connecting printed circuit boards including the steps of:
   applying electroconductive adhesive to ends of a first circuit pattern, said first circuit pattern being located on a first insulating base material, said first circuit pattern and said first base material defining a first printed circuit board;
   aligning said ends of said first circuit pattern with corresponding ends of a second circuit pattern, said second circuit pattern being located on a second insulating base material, said second circuit pattern and said second base material defining a second printed circuit board;
   said first and second base materials being different materials;
   extending said ends of said first circuit pattern outwardly from said first base material;
   forming at least one tooth shape in said first base material, said tooth shape corresponding to said outwardly extended ends of said first circuit pattern;
   bending said at least one tooth shape downwardly to form a single overlapping structure; and
   bringing said corresponding ends of said first and second circuit patterns together under pressure to form physical and electrical connections.

2. The method of claim 1 including:
   applying electroconductive adhesive to said ends of said second circuit pattern.

3. The method of claim 1 including:
   providing a flexible printed circuit board as said first printed circuit board; and
   providing a hard printed circuit board as said second printed circuit board.

4. The method of claim 3 including:
   applying electroconductive adhesive to said ends of said first base material; and
   bending said ends back upon themselves with the ends of said first circuit pattern being on the exterior side of the bend.

5. An interconnected circuit board array including:
   a first circuit board having a first base material and a first circuit pattern of conductive elements thereon;
   a second circuit board having a second base material and a second circuit pattern of conductive elements thereon corresponding to said first circuit pattern;
   one of said base materials being a flexible material defining its circuit board as a flexible circuit board and the other of said base materials being a hard material defining its circuit board as a hard circuit board;
   said first circuit pattern including ends and wherein said ends of said first circuit pattern extend from said first base material;
   said first base material being flexible and having at least one tooth shape which corresponds to said outwardly extended ends of said first circuit pattern;
   said at least one tooth shape being bent backward upon itself, with the conductive elements on the outer side of the bend; and
   electroconductive adhesive between said first and second circuit patterns forming a physical and electrical connection therebetween.

* * * * *